United States Patent [19]
Magette

[11] Patent Number: 6,031,715
[45] Date of Patent: Feb. 29, 2000

[54] COMPONENT MOUNTING MODULE FOR PRINTED CIRCUIT ASSEMBLIES

[75] Inventor: Robert Magette, Nampa, Id.

[73] Assignee: Micron Electronics, Inc., Nampa, Id.

[21] Appl. No.: 08/974,543

[22] Filed: Nov. 19, 1997

[51] Int. Cl.[7] .................................. G06F 1/16; H05K 7/12
[52] U.S. Cl. ........................... 361/683; 361/801; 439/377
[58] Field of Search .................................. 361/679, 683, 361/684, 748, 758, 755, 756, 759, 801, 802; 439/377, 64

[56] References Cited

U.S. PATENT DOCUMENTS

| | | | |
|---|---|---|---|
| 3,567,998 | 3/1971 | Ammerman | 317/101 |
| 3,775,643 | 11/1973 | Schachnow et al. | 317/101 DH |
| 3,829,741 | 8/1974 | Athey | 317/101 DH |
| 4,070,081 | 1/1978 | Takahashi | 339/91 R |
| 4,080,031 | 3/1978 | Sawford-Atkins | 339/65 |
| 4,168,877 | 9/1979 | Little et al. | 339/103 M |
| 4,598,962 | 7/1986 | Reitz et al. | 339/17 L |
| 4,901,204 | 2/1990 | Hayashi | 361/417 |
| 4,914,552 | 4/1990 | Kecmer | 361/415 |
| 5,001,606 | 3/1991 | Kreiner | 361/415 |
| 5,290,174 | 3/1994 | Woratyla et al. | 439/59 |
| 5,359,489 | 10/1994 | Hass et al. | 361/732 |
| 5,417,580 | 5/1995 | Tsai | 439/328 |
| 5,542,854 | 8/1996 | Bowen | 439/157 |
| 5,642,263 | 6/1997 | Lauruhn | 361/801 |
| 5,650,617 | 7/1997 | Hsu | 361/759 |
| 5,726,865 | 3/1998 | Webb et al. | 361/801 |
| 5,781,414 | 7/1998 | Mills et al. | 361/786 |
| 5,822,197 | 10/1998 | Thuault | 361/803 |
| 5,829,601 | 11/1998 | Yurchenco et al. | 211/41.17 |
| 5,889,656 | 3/1999 | Yin | 361/801 |
| 5,928,024 | 7/1999 | Ming-Huang | 439/377 |

*Primary Examiner*—Benjamin R. Fuller
*Assistant Examiner*—Jagdish Patel
*Attorney, Agent, or Firm*—Perkins Coie LLP

[57] ABSTRACT

An apparatus for attaching processors and other components to printed circuit assemblies. One particularly useful application for several embodiments of the invention is attaching a single-edge-contact processor to a PCB. In one embodiment, a mounting-module for attaching a component to a PCB is attached to the PCB prior to being shipped to a final device manufacturer. The component has a component height greater than a desired shipping height for the printed circuit board. The mounting-module, more particularly, may have a base attached to the printed circuit board and a component holder attachable to the base. The base and component holder together may have a first height less than the desired shipping height when the component holder is in a detached or lowered position. As such, the base may be attached to the printed circuit board prior to shipping without adversely impacting the shipping costs. The component holder may accordingly be raised or attached to the base to hold the component at the component height after shipping to a device manufacturer. The base and the component holder together may thus be configured to position the component at a desired location on the printed circuit board when the component holder is raised or attached to the base in an assembled position after shipping.

44 Claims, 7 Drawing Sheets

COMPONENT MOUNTING MODULE FOR PRINTED CIRCUIT ASSEMBLIES

TECHNICAL FIELD

This invention relates to manufacturing electronic devices having printed circuit assemblies. More specifically, certain embodiments of the invention relate to component mounting modules for protecting and securing particular components to printed circuit boards.

BACKGROUND OF THE INVENTION

In the electronics manufacturing industry, many electronic devices have printed circuit assemblies (PCAs) including one or more printed circuit boards (PCBs) and a plurality of components attached to the PCBs. For example, PCAs are commonly used in computers, televisions, stereos and many other types of electronic devices. Because the electronics manufacturing industry is highly competitive, it is desirable to reduce costs associated with shipping, assembling and inventorying PCBs and the related components for manufacturing a particular PCA. The "Original Equipment Manufacturers" (OEMs) of "motherboards" and "central processing units" (CPUs) used in personal computers are a particularly competitive group of PCA manufacturers that are continually seeking to add value to their products.

Many personal computers now have Pentium 11 CPUs manufactured by Intel Corporation of California. The Pentium II® unlike its predecessors, is a single-edge-contact unit that is coupled to a contact slot in the motherboard in an upright position along a single edge. Pentium II CPUs generally extend to a height well above the other components on the motherboard, and thus the Pentium II CPUs may be damaged or broken during handling, shipping and operation. To protect the Pentium II CPUs, OEMs generally require that a fixed bracket be mounted to the motherboard proximate to the contact slot in the motherboard. The fixed brackets generally extend to the height of the Pentium II CPUs. The fixed brackets and Pentium II CPUs, however, extend from the motherboards by such a great distance that they significantly reduce the number of motherboards that may be shipped in a given container. Thus, to reduce shipping costs and protect the CPUs, OEMs generally ship the fixed brackets and the Pentium II CPUs separately from the motherboards. A computer manufacturer then attaches the Pentium II CPUs to the motherboards while assembling personal computers.

To attach Pentium II CPUs to motherboards, computer manufacturers usually mount the fixed brackets to the motherboards at a CPU mounting site on the motherboard near the contact slot. The fixed brackets accordingly protect and hold the Pentium II CPUs in a desired operating position relative to the motherboards. Computer manufacturers, and especially custom computer manufacturers that assemble each computer to order, incur additional costs to mount the fixed brackets to the motherboards. For example, custom computer manufacturers must maintain significant inventories of brackets and fasteners that increase the overhead costs to individually assemble each computer to order. Custom computer manufacturers must also expend additional labor resources to mount the fixed brackets to the motherboards, and additional administrative resources may be required to manage the inventory and labor. Thus, it would be desirable to reduce the computer manufacturer's costs to attach Pentium II CPUs to motherboards without increasing the OEMs' shipping costs.

SUMMARY OF THE INVENTION

The present invention relates to apparatuses and methods for attaching processors and other components to printed circuit assemblies. One particularly useful application for several embodiments of the invention is attaching a single-edge-contact processor to a PCB. In one embodiment, a mounting-module for attaching a component to a PCB is attached to the PCB prior to being shipped to a final device manufacturer. The component has a component height greater than a desired shipping height for the printed circuit assembly. The mounting-module, more particularly, may have a base attached to the printed circuit board and a component holder attachable to the base. The base and component holder together may have a first height less than the desired shipping height when the component holder is in a detached or lowered position. As such, the base may be attached to the printed circuit board prior to shipping without adversely impacting the shipping costs. The component holder may accordingly be raised or attached to the base to hold the component at the component height after shipping the printed circuit assembly to a device manufacturer. The base and the component holder together may thus be configured to position the component at a desired location on the printed circuit board when the component holder is raised or attached to the base in an assembled position after shipping.

In one particular embodiment, the base may have a first footing attached to the printed circuit board on one side of a mounting site for the component, a second footing attached to the printed circuit board on another side of the mounting site, and a plurality of first lock-elements such that each of the first and second footings have at least one first lock-element. The component holder may accordingly have a first support-member attachable to the first footing, a second support-member attachable to the second footing, and a plurality of second lock-elements such that each of the first and second support-members has at least one second lock-element. The first and second lock-elements are configured to engage one another when the support-members are raised or attached to the footings to hold the support-members in the assembled position.

The first and second support-members may have several different configurations with respect to the base. For example, in one embodiment, the first and second support-members may be first and second legs pivotally attached to the first and second footings. In another embodiment, the first and second support-members may be first and second legs slidably attached to the first and second footings. In still another embodiment, the first and second support-members may be first and second snap-on legs detachable from the first and second footings.

In operation, an OEM of printed circuit assemblies may attach the base onto a printed circuit board with the component holder in the lowered or detached position. A plurality of printed circuit assemblies with mounting-modules are then packaged and shipped to a computer manufacturer or other type of device manufacturer. After the printed circuit assemblies are shipped, the component holder is raised or attached to the base in the assembled position and a processor is inserted into the mounting-module.

DETAILED DESCRIPTION OF THE INVENTION

The present invention is directed toward apparatuses and methods for assembling computers and other electronic devices. Many specific details of certain embodiments of the invention are set forth in the following description and in FIGS. 1A–6 to provide a thorough understanding of such embodiments. One skilled in the art, however, will understand that the present invention may have additional embodiments and may be practiced without several of the details described below or shown in FIGS. 1A–6.

Figure 1A:
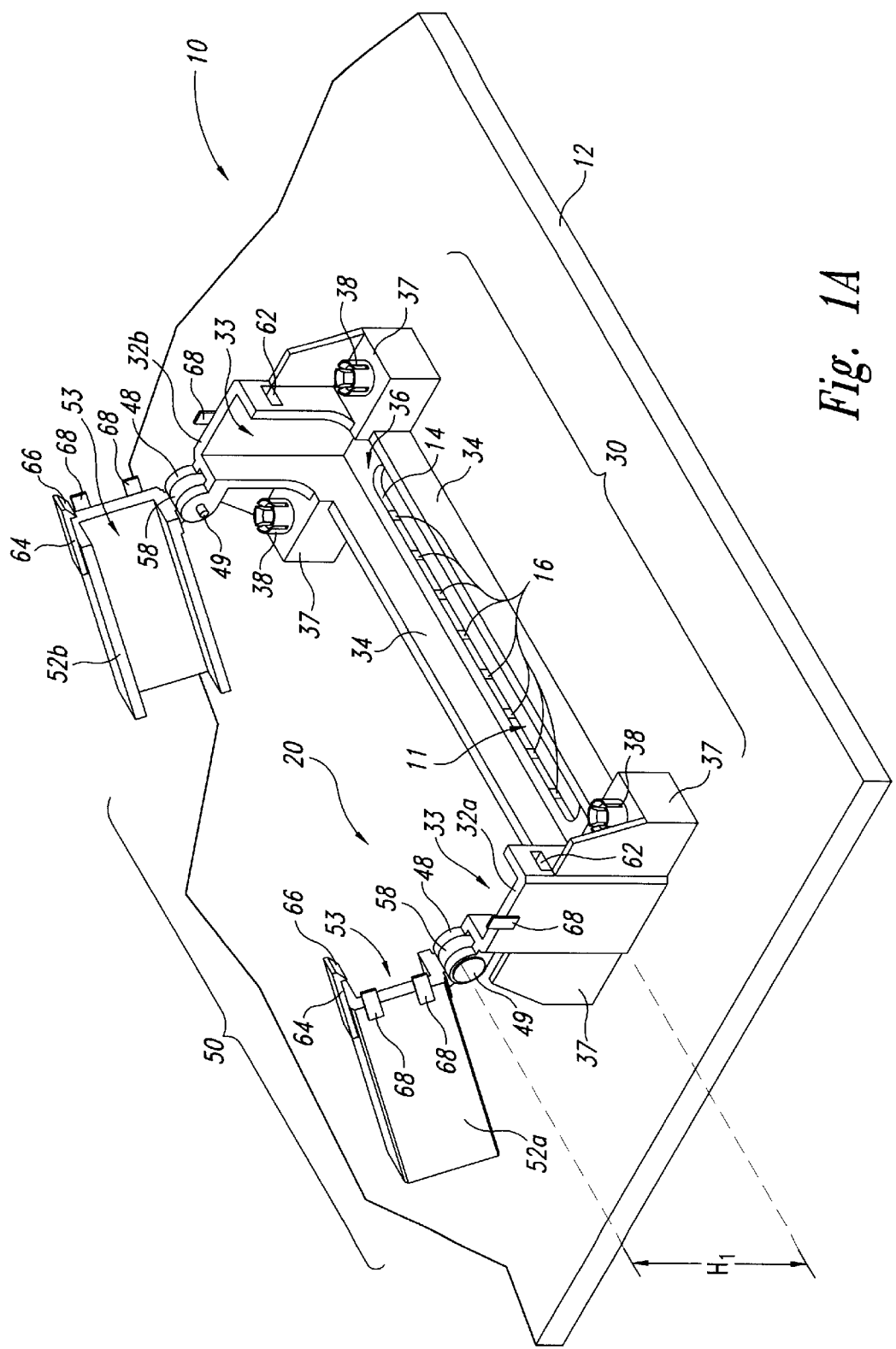
FIG. 1A is a partial isometric view of a printed circuit assembly with a mounting-module in accordance with an embodiment of the invention shown in a lowered position.
Figure 1B:
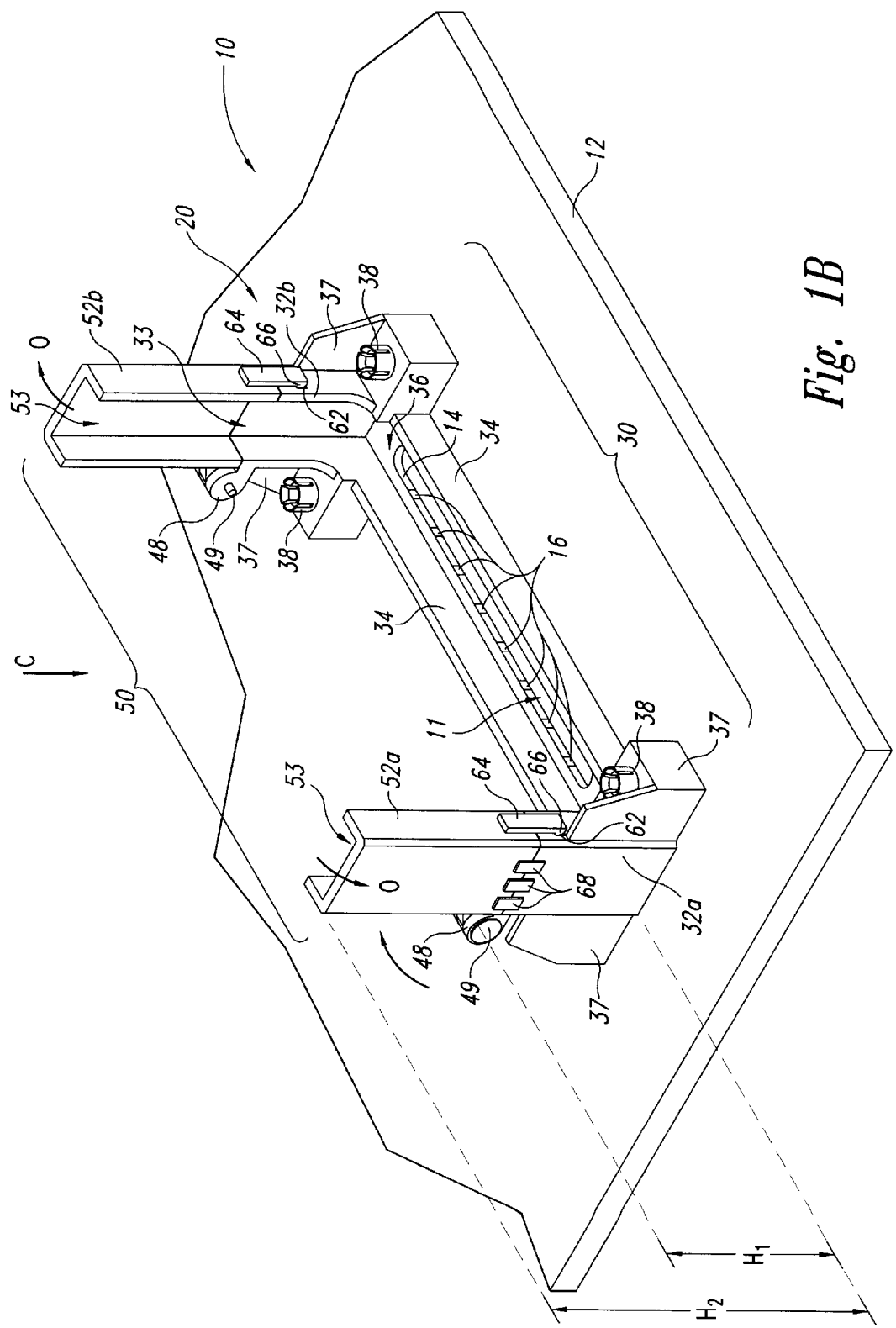
FIG. 1B is a partial isometric view of the printed circuit assembly of FIG. 1A with the mounting-module shown in a raised position.

FIGS. 1A and 1B are partial isometric views of a printed circuit assembly 10 with a PCB 12 and a mounting-module or retention module 20 attached to the PCB 12. The PCB 12 may have a contact site 11 for coupling an electronic component (not shown) to the PCB 12. For example, the contact site 11 may have an elongated aperture 14 with a number of contacts 16 to couple a single-edge-contact component (not shown) to the PCB 12. One particular type of single-edge-contact component may be a Pentium II processor manufactured by Intel Corporation of California. The mounting-module 20 may have a base 30 attached to the PCB 12 and a component holder 50 pivotally attached to the base 30. As described in further detail below, the component holder 50 pivots between a lowered position (FIG. 1A) for shipping and a raised or assembled position (FIG. 1B) for holding a single-edge-contact component at the contact site 11.

The base 30 may have a plurality of footings 32 (individually identified by reference numbers 32a and 32b) that may be attached to the PCB 12 prior to shipping. For example, a first footing 32a defining a first end of the base 30 may be attached to the PCB 12 at one end of the elongated aperture 14, and a second footing 32b defining a second end of the base 30 may be attached to the PCB 12 at the other end of the elongated aperture 14. The footings 32 may each have a channel 33 configured to hold a side of a component, a plurality of flanges 37, and a hole 38 through each flange 37 to receive a fastener (not shown). The base 30 may accordingly be attached to the PCB 12 with a number of fasteners (not shown) positioned through the holes 38. A crossbar 34 may extend between the first and second footings 32a and 32b, and the crossbar 34 may have a slot 36 to receive the lower end of the component (not shown). In this embodiment, a hinge 48 at an upper portion of each footing 32 couples the base 30 to a lower portion of the component holder 50.

The component holder 50 may have a plurality of support-members 52 (individually identified by reference numbers 52a and 52b) attached to the footings 32 of the base 30. For example, a first support-member 52a defining a first leg of the component holder 50 may be pivotally attached to the first footing 32a, and a second support-member 52b defining a second leg of the component holder 50 may be pivotally attached to the second footing 32b. The support-members 52, more specifically, may be pivotally attached to the footings 32 by a pin 49 received through the hinges 48 and fingers 58 projecting from the bottom portion of the support-members 52. The support-members 52 may each have a channel 53 configured to hold an upper portion of the component.

The base 30 and the component holder 50 may have a lock or fastening system in which each footing 32 has a first lock-element 62 and each support-member 52 has a second lock-element 64. In one embodiment, the first lock-element 62 is a notch in an upper portion of each footing 32, and the second lock-element 64 is a tab depending from a lower portion of each support-member 52. A nub 66 may project inwardly from the tab 64 to engage the notch 62 when the support-members 52 are positioned in the raised position (FIG. 1B). Additionally, a number of guides 68 projecting from the upper ends of the footings 32 and the lower ends of the support-members 52 may restrict the support-members 52 from bending outward (arrows O).

The mounting-module 20 may have a first height for shipping and a second height for supporting and protecting a component coupled to the PCB 12. Referring to FIG. 1A, for example, the support-members 52 are pivoted into the lowered or shipping position in which the height of the mounting-module 20 is at a first height $H_1$ not greater than a desired shipping height for the printed circuit assembly 10. Referring to FIG. 1B, the support-members 52 are rotated until the second lock-elements 64 engage the first lock-elements 62. At this point, the support-members 52 are in the raised or assembled position in which a component (not shown) may be inserted (arrow C) into the channels 53 and 33 to couple the component with the contacts 16 in the elongated aperture 14.

Figure 2A:
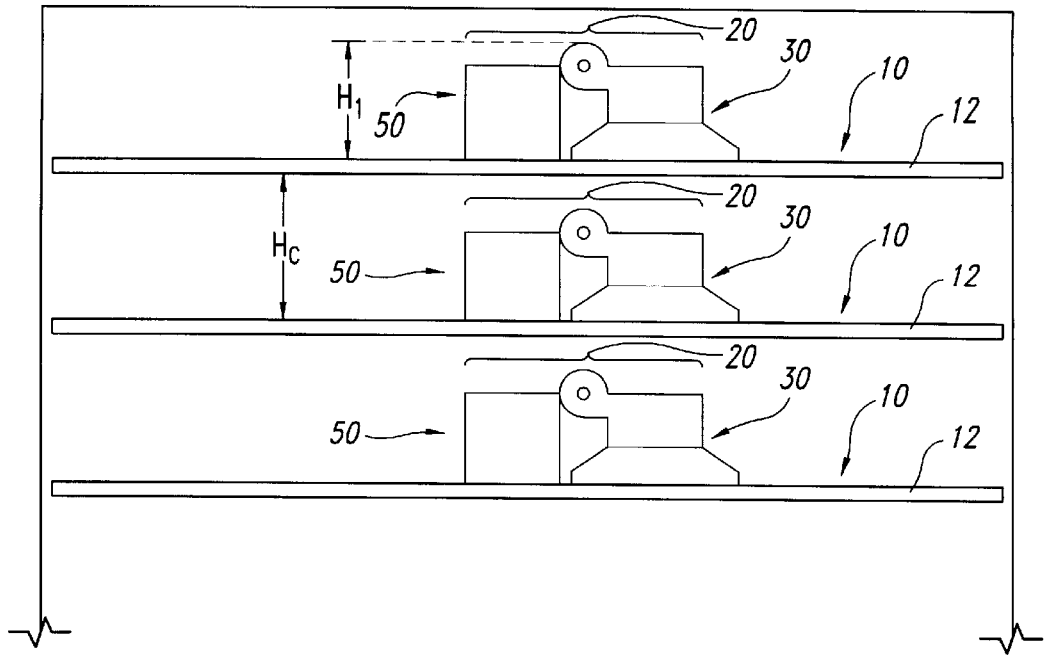
FIG. 2A is a schematic side-elevational view illustrating an aspect of operating an embodiment of a mounting-module.
Figure 2B:
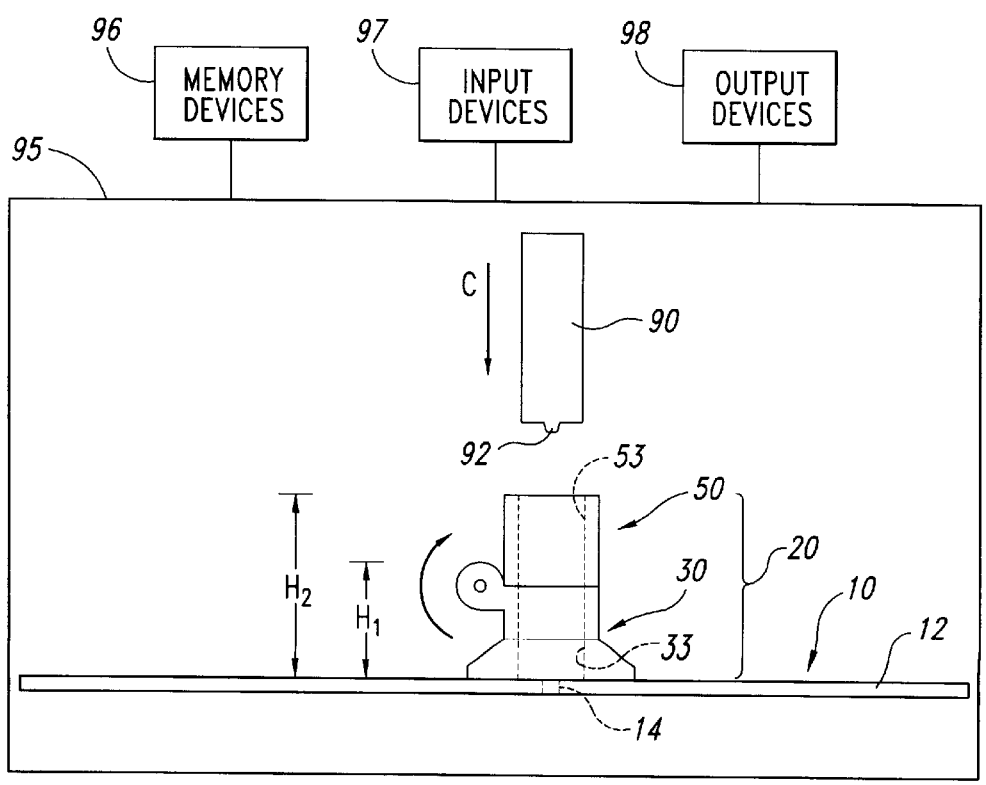
FIG. 2B is a schematic side-elevational view of a computer illustrating another aspect of operating an embodiment of a mounting-module.

FIGS. 2A and 2B are schematic side elevational views depicting different aspects of the operation of the mounting-module 20. Referring to FIG. 2A, an OEM of motherboards or other printed circuit assemblies attaches the base 30 of each mounting-module 20 to a PCB 12. The OEM then places a plurality of printed circuit assemblies 10 in a single package with the component holders 50 in the lowered position. The overall height $H_1$ of each mounting-module 20 when the component holder 50 is in the lowered is preferably not greater a desired shipping height $H_C$ for the printed circuit assemblies 10. The mounting-modules 20, therefore, do not reduce the number of printed circuit assemblies 10 that an OEM may ship in a standard container for the printed circuit assemblies 10. After shipping, a computer manufacturer or other type of device manufacturer rotates the component holder 50 to the raised position (FIG. 2B) and inserts a component 90 into the channels 53 and 33. In the case of a Pentium II or other type of single-edge-contact component with a contact edge 92, the component 90 is inserted into the mounting-module 20 until the contact edge 92 engages the contacts (not shown) in the elongated aperture 14. The printed circuit assembly 10 is then ready for additional components and/or installation into a computer 95 having memory devices 96, input devices 97 and output devices 98.

The embodiment of the mounting-module 20 shown in FIGS. 1A–2B is expected to reduce the costs of assembling computers and other devices without increasing the shipping costs to OEMs of motherboards and other printed circuit assemblies. One particularly useful application of the mounting-module 20 is assembling single-edge-contact Pentium II processors to motherboards at a custom computer manufacturer. As explained above, custom computer manufacturers typically assembly each computer to order, and thus they generally maintain large inventories of different processors and install each processor onto a particular motherboard for each individual order. The mounting-module 20 reduces the cost to install a processor at a custom computer manufacturer because having the OEM pre-assemble the mounting-module 20 to the PCB 12 reduces the labor and the inventory that the custom computer manufacturer must provide. Additionally, the mounting-module 20 is not expected to increase shipping costs for OEMs because printed circuit assemblies with the mounting-modules do not occupy any more space than those without the modules.

Figure 3:
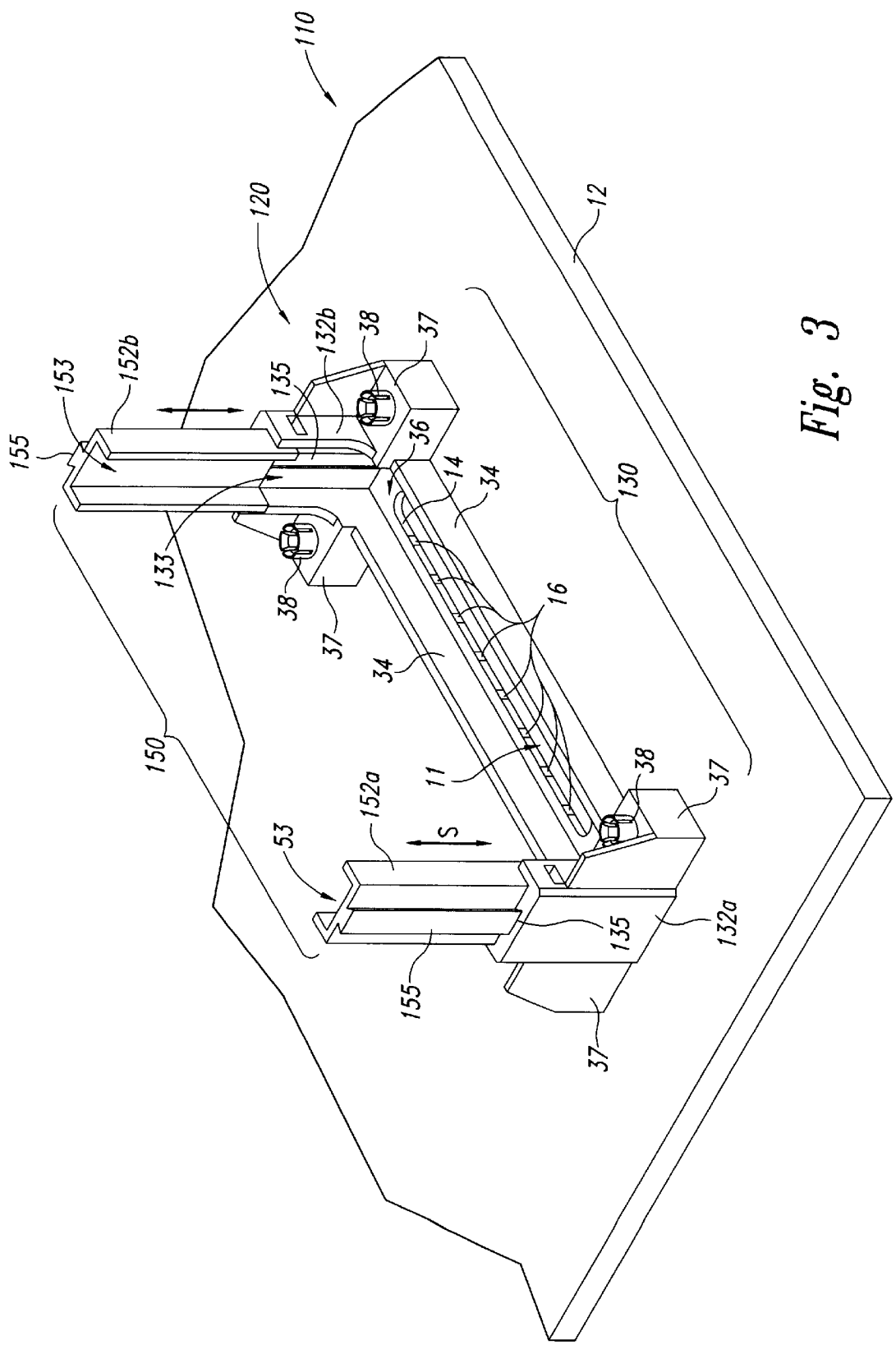
FIG. 3 is a partial isometric view of a printed circuit assembly with another mounting-module in accordance with another embodiment of the invention.

FIG. 3 is an isometric view of a printed circuit assembly 110 with another embodiment of a mounting-module 120 attached to the PCB 12 at the contact site 11. In this embodiment, the mounting-module 120 has a base 130 and a component holder 150 slidably attached to the base 130. The base 130 and component holder 150 are similar to the base 30 component holder 50 shown in FIG. 1A, and thus like reference numbers refer to like parts. However, the base 130 has first and second footings 132a and 132b with trapezoidal guide channels 135 extending into the footings from an inner channel 133. The component holder 150 may thus have first and second support-members 152a and 152b slidably attached to the first and second footings 132a and 132b. The support-members 152 may each have a trapezoidal rail 155 received in a corresponding guide channel 135 to hold the support members 152 to the footings 132 while allowing the support members 152 to slide along the footings 132. The first and second support-members 152a and 152b accordingly slide (arrow S) between the lowered position for shipping (not shown) and the raised position for holding a component (not shown) at the contact site 11.

Figure 4:
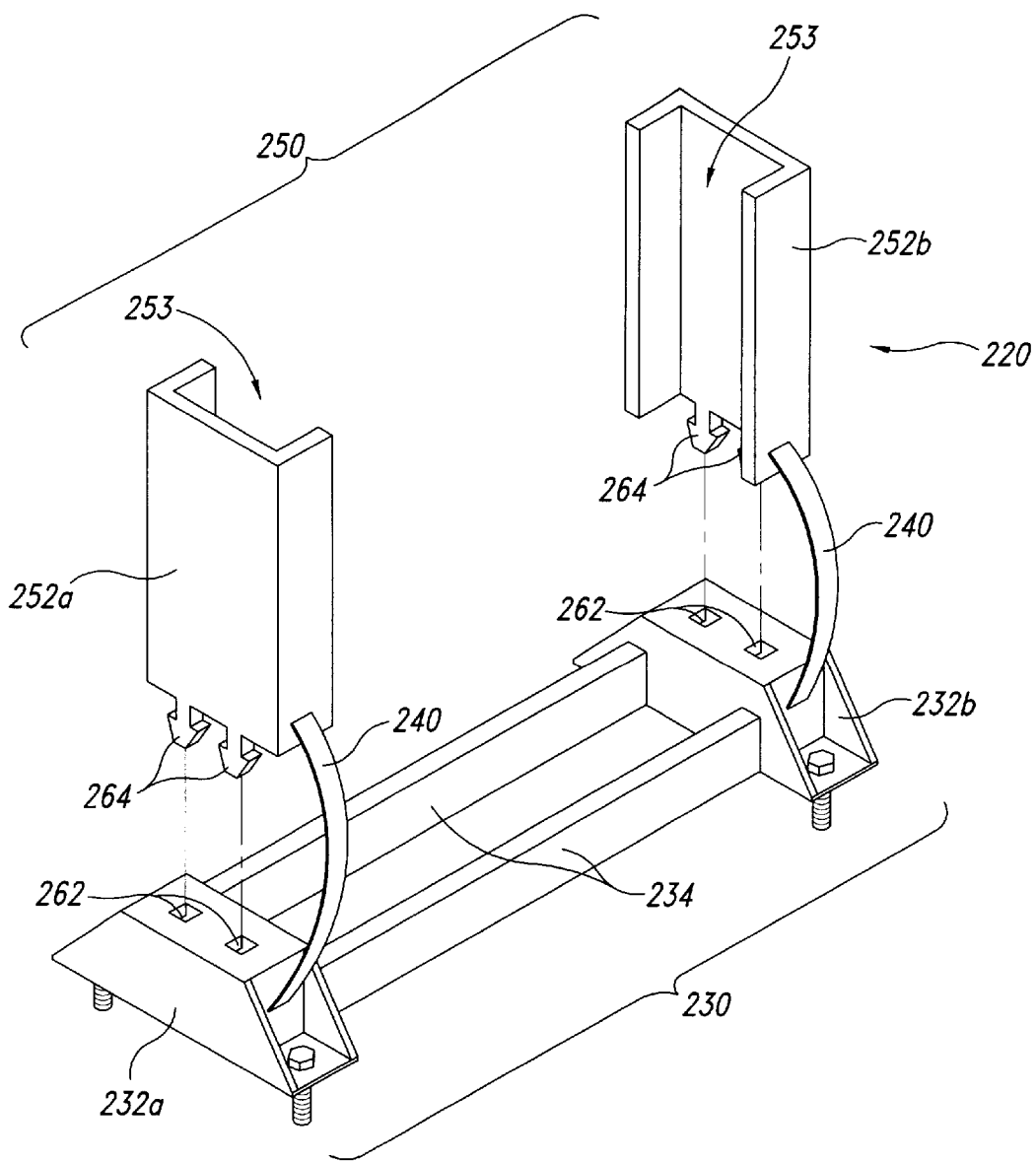
FIG. 4 is an isometric view of yet another mounting-module in accordance with yet another embodiment of the invention.

FIG. 4 is an isometric view of another embodiment of a mounting-module 220 with a base 230 and a component holder 250 attachable to the base 230. In this embodiment, the base 230 may have first and second footings 232 (individually identified by reference numbers 232a and 232b) connected together by a crossbar 234, and the component holder 250 may have first and second detachable or snap-on legs 252 (individually identified by referenced numbers 252a and 252b). Each snap-on leg 252 may be tethered to a footing 232 by a thin, flexible line 240. A plurality of first lock-elements 262 in the top surface of the footings 232 may receive a corresponding plurality of second lock-elements 264 depending from the snap-on legs 252 to hold the snap-on legs 252 to the footings 232. Each of the snap-on legs 252 may also have a channel 253 to receive an upper portion of a component (not shown) in a manner that holds and protects the component.

In operation, an OEM of printed circuit assemblies attaches the base 230 to a PCB prior to shipping, and then a final device manufacturer attaches the snap-on legs 252 to the footings 232 prior to assembling components to the PCBs. When the snap-on legs 252 are detached from the footings 232, the mounting-module 230 has a height less than the desired shipping height for the printed circuit assembly. Thus, the mounting-module 220 is expected to have many of the same benefits as the mounting-module 20 described above in FIGS. 1A–2B.

Figure 5:
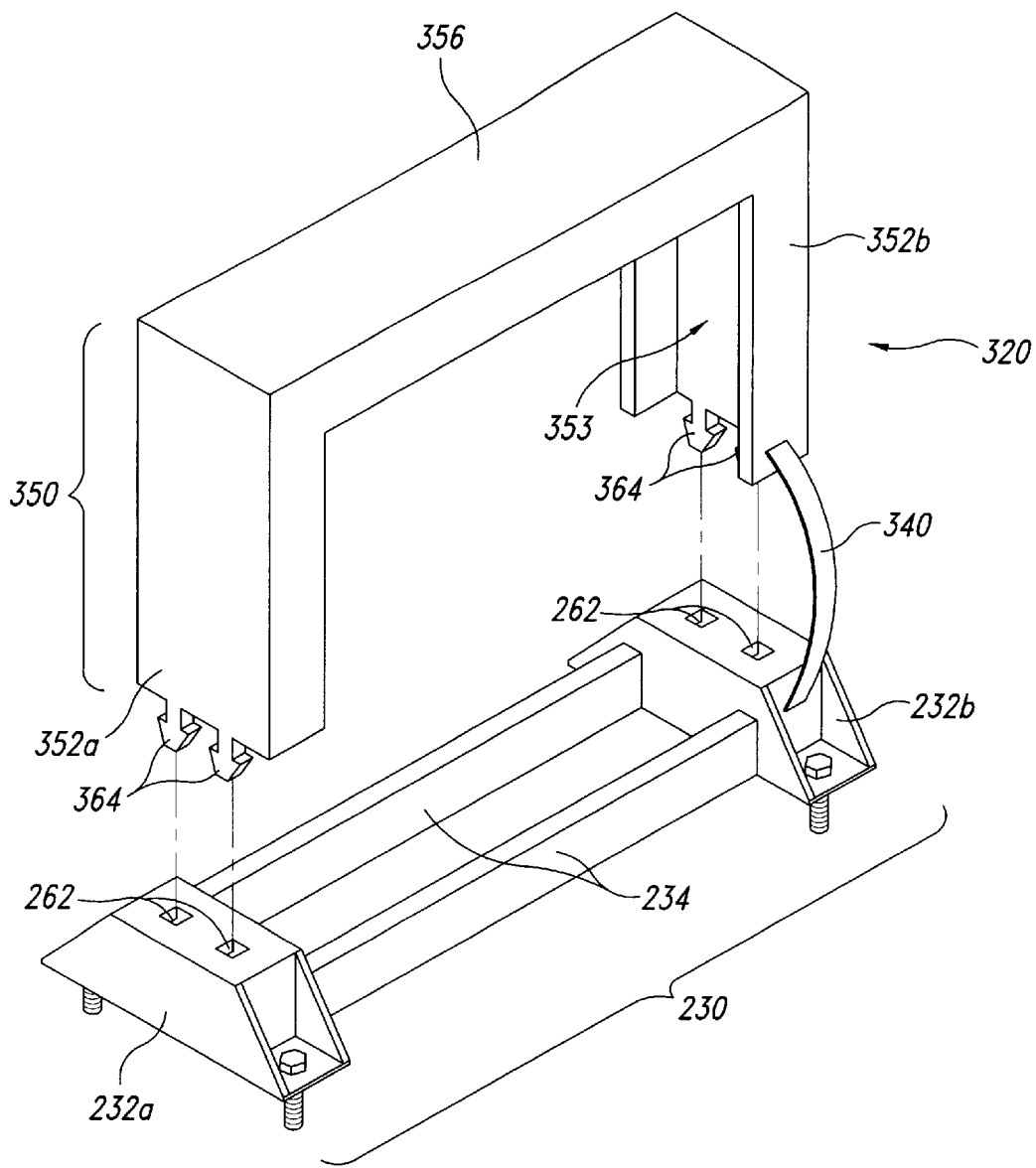
FIG. 5 is an isometric view of still another mounting-module in accordance with still another embodiment of the invention.

FIG. 5 is an isometric view of still another embodiment of a mounting-module 320 with the base 230 and a different component holder 350 attachable to the base 230. The base 230 may be the same as discussed above with respect to FIG. 4, and thus the base 230 may have first and second footings 232a and 232b connected to a crossbar 234. The component holder 350, however, may have a frame with a top member 356 and detachable, snap-on legs 352 (individually identified by reference numbers 352a and 352b) attached to the ends of the top member 356. A plurality of second lock-elements 264 may depend from the snap-on legs 352 to engage a corresponding plurality of first lock-elements 262 in the footings 232 in a manner that holds the snap-on legs 352 to the footings 232. The snap-on legs 352 and the top member 356 may define a channel 353 to receive an upper portion of a component (not shown) in a manner that holds and protects the component on the PCB (not shown). Additionally, the component holder 350 may be tethered to the base 230 by a thin, flexible line 340 connected to one of the footings 232 and a corresponding snap-on leg 252. As with the mounting-module 220, an OEM attaches the base 230 to the printed circuit board prior to shipping, and then a final device manufacturer attaches the component holder 350 to the base 230 to assemble a component to the PCB.

Figure 6:
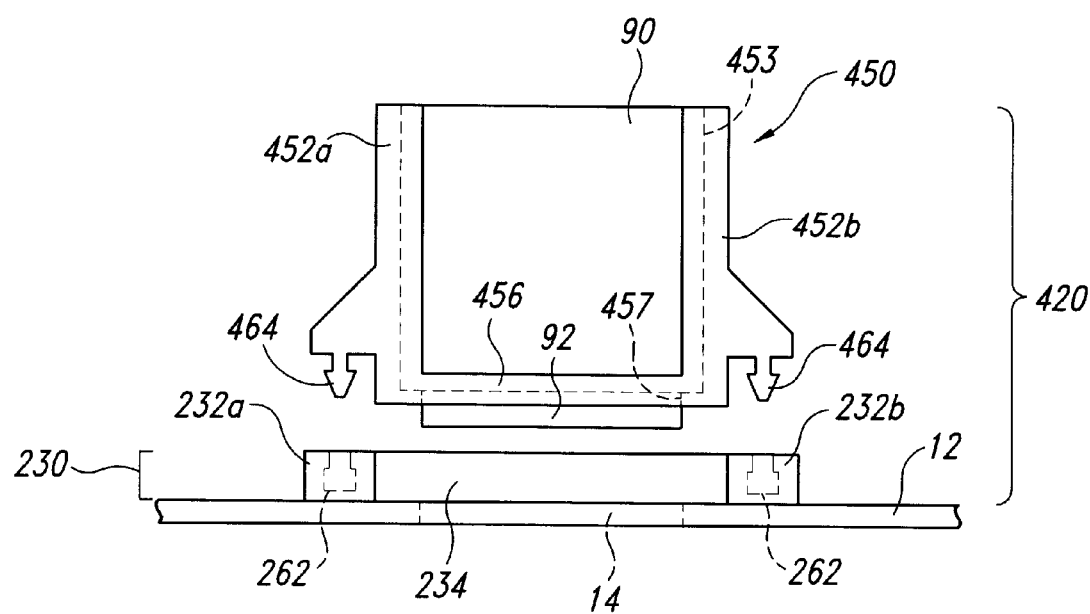
FIG. 6 is a schematic front-elevational view of yet another mounting-module in accordance with yet another embodiment of the invention.

FIG. 6 is a schematic front elevational view of yet another mounting-module 420 with the base 230 and a component holder 450 attachable to the base 230. In this embodiment, the component holder 450 may be a casing having a bottom member 456 with side members 452 (individually identified by reference numbers 452a and 452b) attached to the ends of the bottom member 456. The side members 452 and the bottom member 456 may define channel 453 to hold an upper portion of a component 90. Additionally, the bottom member 456 may have a slit 457 to allow the contact edge 92 of the component 90 to project beyond the bottom member 456 and engage a slot (not shown) in a PCB (not shown). Each of the side members 452 may have a second lock-element 464 configured to mate with a first lock-element 262 in one of the footings 232. In operation, an OEM attaches the base 230 to a PCB prior to shipping, and then a final device manufacturer attaches the side members 452 to the footings 232.

From the foregoing it will be appreciated that, although specific embodiments of the invention have been described herein for purposes of illustration, various modifications may be made without deviating from the spirit and scope of the invention. Referring to FIG. 6, for example, the side members 452 and the bottom member 456 may be integral with the packaging for the component 90. Accordingly, the invention is not limited except as by the appended claims.

I claim:

1. A computer comprising:

a printed circuit assembly having printed circuit board with a contact site including an elongated aperture configured to receive a contact edge of a single-edge-contact processor and a plurality of contact pads to operatively connect the processor to circuitry in the printed circuit board;

a single-edge-contact processor coupled to the printed circuit assembly at the contact site, the processor having a first side;

a memory device operatively coupled to the processor;

an input device operatively coupled to the processor;

an output device operatively coupled to the processor; and a mounting module to secure the single-edge-contact processor to the contact site, the mounting module having a base attached to the printed circuit board and a component holder attached to the base, the base having a first end and a second end, the component holder being moveable into a lower position in which the component holder and base together have a first height less than a desired shipping height, and the component holder being moveable into a raised position in which the component holder and the base together are configured to secure the processor at the contact site in an assembled position in which the processor and the component holder extend to a second height greater than the desired shipping height, and wherein the component holder comprises a first leg having a lower portion pivotally attached to the first end of the base at a first hinge and a second leg having a lower portion pivotally attached to the second end of the base at a second hinge, each of the first and second legs having a first side, a second side opposite the first side, and an intermediate side between the first and second sides, wherein the first hinge is attached the first side of the first leg, and wherein the second hinge is attached to the first side of the second leg.

2. The computer of claim 1 wherein:

the base comprises a first footing attached to the printed circuit board and a first lock-element on the first footing; and the component holder comprises a first support-member configured to hold a first side of the processor and a second lock-element configured to mate with the first lock-element a secure the first support-member to the first footing.

3. The computer of claim 2 wherein the first support-member is attached to the first side of the processor.

4. The computer of claim 2 wherein:

the first lock-element comprises a hole in a top surface of the first footing and a lip extending across a portion of the hole;

the first support-member is attached to the first side of the processor; and the second lock-element comprises a tab with a nub, the tab and nub being received in the hole of the first lock-element and the nub engaging a bottom surface of the lip to lock the first support-member to the first footing.

5. The computer of claim 1 wherein:

the base comprises a first footing attached to the printed circuit board on one side of a mounting site for the component, a second footing attached to the printed circuit board on another side of the mounting site, and a plurality of first lock-elements, each of the first and second footings having at least one first lock-element; and the component holder comprises a first support-member attachable to the first footing, a second support-member attachable to the second footing, and a plurality of second lock-elements, each of the first and second support-members having at least one second lock-element to engage a corresponding first lock-element.

6. The computer of claim 5 wherein the first and second support-members comprise first and second legs, the first leg being pivotally attached to the first footing and the second leg being pivotally attached to the second footing, the first and second legs each pivoting between the lowered position and the raised position.

7. The computer of claim 6 wherein:

the first leg is configured to hold a first side of a single-edge-contact processor, and the first leg is pivotally attached to a side of the first footing facing a space for a heat exchanger of the processor; and the second leg is configured to hold a second side of the single-edge-contact processor, and the second leg is pivotally attached to a side of the second footing facing the space for the heat exchanger, the first and second legs occupying a portion of the space for the heat exchanger in the lowered position.

8. The computer of claim 5 wherein the base further comprises a crossbar between the first and second footings.

9. The computer of claim 5 wherein the base further comprises a crossbar between the first and second footings, the crossbar having a slot over the mounting site on the printed circuit board to receive and position a contact edge of a single-edge-contact processor.

10. The computer of claim 9 wherein the first and second support-members comprise first and second legs, the first leg being pivotally attached to the first footing and the second leg being pivotally attached to the second footing, the first and second legs each pivoting between the lowered position for shipping and the raised position in which the first and second legs are configured to hold the component in a desired position at the mounting site.

11. A mounting-module pre-assembled onto a printed circuit board prior to shipping for attaching a component to the printed circuit board after shipping, the component having a component height greater than a desired shipping height for the printed circuit board, and the module comprising:

a base attachable to the printed circuit board, the base having first end and a second end; and a component holder attached to the base, the component holder being moveable into a lowered position in which the component holder and base together have a first height less than the desired shipping height, and the component holder being moveable into a raised position in which the component holder and the base together are configured to position the component at a desired location with respect to the printed circuit board in an assembled position, wherein the component holder comprises a first leg having a lower portion pivotally attached to the first end of the base at a first hinge and a second leg having a lower portion pivotally attached to the second end of the base at a second hinge, each of the first and second legs having a first side, a second side opposite the first side, and an intermediate side between the first and second sides, wherein the first hinge is attached to the first side of the first leg, and wherein the second hinge is attached to the first side of the second leg.

12. The module of claim 1 wherein:

the base comprises a first footing attached to the printed circuit board and a first lock-element on the first footing; and the component holder comprises a first support-member configured to hold a first side of the component and a second lock-element configured to mate with the first lock-element a secure the first support-member to the first footing.

13. The module of claim 12 wherein the first support-member is attached to the first side of the component.

14. The module of claim 12 wherein:

the first lock-element comprises a hole in a top surface of the first footing and a lip extending across a portion of the hole;

the first support-member is attached to the first side of the component; and the second lock-element comprises a tab with a nub, the tab and nub being received in the hole of the first lock-element and the nub engaging a bottom surface of the lip to lock the first support-member to the first footing.

15. The module of claim 1 wherein:

the base comprises a first footing attached to the printed circuit board on one side of a mounting site for the component, a second footing attached to the printed circuit board on another side of the mounting site, and a plurality of first lock-elements, each of the first and second footings having at least one first lock-element; and the component holder comprises a first support-member attachable to the first footing, a second support-member attachable to the second footing, and a plurality of second lock-elements, each of the first and second support-members having at least one second lock-element to engage a corresponding first lock-element.

16. The module of claim 15 wherein the first and second support-members comprise first and second legs, the first leg being pivotally attached to the first footing and the second leg being pivotally attached to the second footing, the first and second legs each pivoting between the lowered and raised positions.

17. The module of claim 16 wherein:

the first leg is configured to hold a first side of a single-edge-contact processor, and the first leg is pivotally attached to a side of the first footing facing a space for a heat exchanger of the processor; and the second leg is configured to hold a second side of the single-edge-contact processor, and the second leg is pivotally attached to a side of the second footing facing the space for the heat exchanger, the first and second legs occupying a portion of the space for the heat exchanger in the lowered position.

18. The module of claim 15 wherein the base further comprises a crossbar between the first and second footings.

19. The module of claim 15 wherein the base further comprises a crossbar between the first and second footings, the crossbar having a slot over the mounting site on the printed circuit board to receive and position a contact edge of a single-edge-contact processor.

20. The module of claim 19 wherein the first and second support-members comprise first and second legs, the first leg being pivotally attached to the first footing and the second leg being pivotally attached to the second footing, the first and second legs each pivoting between the lowered position for shipping and the raised position in which the first and second legs are configured to hold the component in a desired position at the mounting site.

21. A mounting-module pre-assembled onto a printed circuit board prior to shipping for attaching a component to the printed circuit board after shipping, the component having a component height greater than a desired shipping height for the printed circuit board, and the module comprising:

a base attachable to the printed circuit board, the base having a first end and a second end; and a component holder attached to the base, the component holder being moveable into a lowered position in which the base and the component holder extend from the printed circuit board to a height proximate to other components mounted to the printed circuit board, and the component holder being moveable into an assembled position to extend from the printed circuit board to a second height above the other components on the printed circuit board, wherein the base and the component holder together being configured to position the component at a desired location on the printed circuit board when the component holder is in the assembled position, and wherein the component holder comprises a first leg having a lower portion pivotally attached to the first end of the base at a first hinge and a second leg having a lower portion pivotally attached to the second and at a second a second hinge, each of the first and second le gs having a first side, a second side opposite the first side, and an intermediate side between the first and second sides, wherein the first hinge is attached to the first side of the first leg, and wherein the second hinge is attached to the first side of the second leg.

22. The module of claim 21 wherein:

the base comprises a first footing attached to the printed circuit board and a first lock-element on the first footing; and the component holder comprises a first support-member configured to hold a first side of the component and a second lock-element configured to mate with the first lock-element a secure the first support-member to the first footing.

23. The module of claim 21 wherein:

the base comprises a first footing attached to the printed circuit board on one side of a mounting site for the component, a second footing attached to the printed circuit board on another side of the mounting site, and a plurality of first lock-elements, each of the first and second footings having at least one first lock-element; and the component holder comprises a first support-member attachable to the first footing, a second support-member attachable to the second footing, and a plurality of second lock-elements, each of the first and second support-members having at least one second lock-element to engage a corresponding first lock-element.

24. The module of claim 23 wherein the first and second support-members comprise first and second legs, the first leg being pivotally attached to the first footing and the second leg being pivotally attached to the second footing, the first and second legs each pivoting between the lowered and assembled positions.

25. The module of claim 24 wherein:

the first leg is configured to hold a first side of a single-edge-contact processor, and the first leg is pivotally attached to a side of the first footing facing a space for a heat exchanger of the processor; and the second leg is configured to hold a second side of the single-edge-contact processor, and the second leg is pivotally attached to a side of the second footing facing the space for the heat exchanger, the first and second legs occupying a portion of the space for the heat exchanger in the lowered position.

26. The module of claim 23 wherein the base further comprises a crossbar between the first and second footings, the crossbar having a slot over the mounting site on the printed circuit board to receive and position a contact edge of a single-edge-contact processor.

27. The module of claim 26 wherein the first and second support-members comprise first and second legs, the first leg being pivotally attached to the first footing and the second leg being pivotally attached to the second footing, the first and second legs each pivoting between the lowered position for shipping and the assembled position in which the first and second legs are configured to hold the component in a desired position at the mounting site.

28. A retention module for attaching a component to a printed circuit boards comprising:

a base mountable to the printed circuit board, the base having a first end and a second end, a first leg attached to the first end of the base, the first leg having a first side a second side opposite the first side, and an intermediate side between the first and second sides; and a second leg attached to the second end of the base and generally opposed to the first leg, the second leg having a first side, a second side opposite the fist side, and an intermediate side between the first and second sides, the first and second legs being adjustable between a lowered position in which the retention module has a height approximate to a desired shipping height and a raised position in which the retention module extends above the desired shipping height and is configured to hold the component at a desired operating position on the printed circuit board, wherein a first hinge is attached to the first side of the first leg to pivotally attach the first leg to the first end of the base, and wherein a second hinge is attached to the first side of the second leg to pivotally attach the second leg to the second end of the base.

29. The retention module of claim 28 wherein the base further comprises a crossbar between the first and second legs.

30. The retention module of claim 29 wherein the crossbar has a slot over a contact site on the printed circuit board, the slot being configured to receive a contact edge of the component.

31. The retention module of claim 28 wherein the first leg has a first channel configured to engage a first side of the component and the second leg has a second channel configured to engage a second side of the component, the first and second channels positioning the component at the desired operating position when the first and second legs are in the raised position.

32. The retention module of claim 28 wherein the first leg is pivotally attached to the first end of the base and the second leg is pivotally attached to the second end of the base, the first and second legs pivoting from the lowered position to the raised position.

33. The retention module of claim 28, further comprising:

a first lock to secure the first leg in the raised position; and a second lock to secure the second leg in the raised position.

34. The retention module of claim 33 wherein:

the first lock comprises a first tab depending from a lower portion of the first leg and a first notch in an upper portion of the first end of the base, the first tab having a first nub that engages the first notch to secure the first leg in the raised position; and the second lock comprises a second tab depending from a lower portion of the second leg and a second notch in an upper portion of the second end of the base, the second tab having a second nub that engages the second notch to secure the second leg in the raised position.

35. A printed circuit board assembly comprising:

a component having a component height greater than a desired shipping height and a first side;

a printed circuit board having a contact site to operatively connect the component to the printed circuit board;

a base attached to the printed circuit board, the base having a first end and a second end; and a component holder attached to the base, the component holder being moveable into a lower position in which the component holder and base together have a first height less than the desired shipping height, and the component holder being movable into a raised position in which the component holder and the base together are configured to position the component at the contact site when the component holder is attached to the base in an assembled position, and wherein the component holder comprises a first leg having a lower portion pivotally attached to the first end of the base at a first hinge and a second leg having a lower portion pivotally attached to the second end of the base at a second hinge, each of the first and second legs having a first side, a second side opposite the first side, and an intermediate side between the first and second sides, wherein the first hinge is attached to the first side of the first leg, and wherein the second hinge is attached to the first side of the second leg.

36. The printed circuit assembly of claim 35 wherein:

the base comprises a first footing attached to the printed circuit board and a first lock-element on the first footing; and the component holder comprises a first support-member configured to hold a first side of the component and a second lock-element configured to mate with the first lock-element to secure the first support-member to the first footing.

37. The printed circuit assembly of claim 36 wherein the first support-member is attached to the first side of the component.

38. The printed circuit assembly of claim 36 wherein:

the first lock-element comprises a hole in a top surface of the first footing and a lip extending across a portion of the hole;

the first support-member is attached to the first side of the component; and the second lock-element comprises a tab with a nub, the tab and nub being received in the hole of the first lock-element and the nub engaging a bottom surface of the lip to lock the first support-member to the first footing.

39. The printed circuit assembly of claim 35 wherein:

the base comprises a first footing attached to the printed circuit board on one side of a mounting site for the component, a second footing attached to the printed circuit board on another side of the mounting site, and a plurality of first lock-elements, each of the first and second footings having at least one first lock-element; and the component holder comprises a first support-member attachable to the first footing, a second support-member attachable to the second footing, and a plurality of second lock-elements, each of the first and second support-members having at least one second lock-element to engage a corresponding first lock-element.

40. The printed circuit assembly of claim 39 wherein the first and second support-members comprise first and second legs, the first leg being pivotally attached to the first footing and the second leg being pivotally attached to the second footing, the first and second legs each pivoting between the lowered and raised positions.

41. The printed circuit assembly of claim 40 wherein:

the first leg is configured to hold a first side of a single-edge-contact processor, and the first leg is pivotally attached to a side of the first footing facing a space for a heat exchanger of the processor; and the second leg is configured to hold a second side of the single-edge-contact processor, and the second leg is pivotally attached to a side of the second footing facing the space for the heat exchanger, the first and second legs occupying a portion of the space for the heat exchanger in the lowered position.

42. The printed circuit assembly of claim 39 wherein the base further comprises a crossbar between the first and second footings.

43. The printed circuit assembly of claim 39 wherein the base further comprises a crossbar between the first and second footings, the crossbar having a slot over the mounting site on the printed circuit board to receive and position a contact edge of a single-edge-contact processor.

44. The module of claim 43 wherein the first and second support-members comprise first and second legs, the first leg being pivotally attached to the first footing and the second leg being pivotally attached to the second footing, the first and second legs each pivoting between the lowered position for shipping and the raised position in which the first and second legs are configured to hold the component in a desired position at the mounting site.

* * * * *